United States Patent
Bierer et al.

(10) Patent No.: US 9,927,474 B1
(45) Date of Patent: Mar. 27, 2018

(54) PHASE IDENTIFICATION ON A GROUNDED ELECTRICAL POWER SYSTEM

(71) Applicants: Walter S. Bierer, Blythewood, SC (US); Jan Fredrick Kennerly, Jr., Swansea, SC (US)

(72) Inventors: Walter S. Bierer, Blythewood, SC (US); Jan Fredrick Kennerly, Jr., Swansea, SC (US)

( * ) Notice: Subject to any disclaimer, the term of this patent is extended or adjusted under 35 U.S.C. 154(b) by 10 days.

(21) Appl. No.: 15/249,840

(22) Filed: Aug. 29, 2016

Related U.S. Application Data

(60) Provisional application No. 62/213,797, filed on Sep. 3, 2015.

(51) Int. Cl.
G01R 25/00 (2006.01)
H03D 13/00 (2006.01)
G01R 25/08 (2006.01)

(52) U.S. Cl.
CPC .................. G01R 25/08 (2013.01)

(58) Field of Classification Search
CPC .............................. G01R 21/133; G01R 27/14
USPC .............. 324/76.11, 76.61, 76.69, 76.77
See application file for complete search history.

(56) References Cited

U.S. PATENT DOCUMENTS

| | | | |
|---|---|---|---|
| 2,789,268 A | 4/1957 | Bechtel et al. | |
| 3,076,931 A | 2/1963 | Jasper | |
| 3,623,142 A | 11/1971 | Key | |
| 3,824,430 A * | 7/1974 | Hentschel | H02H 3/13 361/175 |
| 3,924,179 A | 12/1975 | Dozier | |
| 4,063,161 A | 12/1977 | Pardis | |
| 4,445,085 A | 4/1984 | Metcalf et al. | |
| 4,445,086 A | 4/1984 | Bulatao | |
| 4,906,938 A | 3/1990 | Konopka | |
| 5,317,253 A | 5/1994 | Kronberg | |
| 5,497,094 A | 3/1996 | George | |
| 5,760,591 A | 6/1998 | Matsuda et al. | |
| 5,929,624 A | 7/1999 | Ricq et al. | |

(Continued)

FOREIGN PATENT DOCUMENTS

| | | |
|---|---|---|
| EP | 0810451 A2 | 12/1997 |
| FR | 2409520 A1 | 8/2016 |
| WO | 9500863 | 1/1995 |

*Primary Examiner* — Giovanni Astacio-Oquendo
(74) *Attorney, Agent, or Firm* — Nexsen Pruet, LLC; Michael A. Mann

(57) ABSTRACT

A method and device for sorting grounded electrical conductors according to phase. Different high-current pulsed sequences are applied to each of the electrical conductors of a first three-phase conductor in an electrical power network. Pulsed current sequences applied to the three electrical conductors of the first conductor, seeking an electrical ground, will be detectable on the electrical conductors of each of the conductors in parallel with the electrical conductors of the first conductor. A detector detects a magnetic-pulsed sequence associated with the current-pulsed sequences on the electrical conductors and matches it to one of the corresponding current-pulsed sequences on the electrical conductors of the first three-phase conductor, thereby decoding the sequence to identify the phases of each of the conductors. Each electrical conductor is then tagged with its phase before the conductor network is ungrounded and energized.

23 Claims, 8 Drawing Sheets

(56) References Cited

U.S. PATENT DOCUMENTS

| | | | | |
|---|---|---|---|---|
| 6,532,139 | B2 * | 3/2003 | Kim | ................... H02H 1/0015 |
| | | | | 361/42 |
| 6,617,972 | B2 * | 9/2003 | Takarada | ........... G08B 21/0484 |
| | | | | 324/538 |
| 6,888,708 | B2 * | 5/2005 | Brungs | .................... H02H 9/08 |
| | | | | 361/42 |
| 8,779,729 | B2 * | 7/2014 | Shiraishi | ............ G01R 31/3606 |
| | | | | 320/134 |
| 2003/0038723 | A1 | 2/2003 | Luebke et al. | |
| 2004/0145486 | A1 | 7/2004 | Campbell et al. | |
| 2012/0098518 | A1 * | 4/2012 | Unagami | ............. G01R 22/066 |
| | | | | 324/74 |

* cited by examiner

PHASE IDENTIFICATION ON A GROUNDED ELECTRICAL POWER SYSTEM

TECHNOLOGICAL FIELD

The present disclosure relates to the operation and maintenance of electric power grids and to restoring power as a result of a power failure in particular.

BACKGROUND

Large cities may have thousands of miles of 3-phase, high-voltage, underground electrical conductors in their electrical power network. Electrical equipment such as transformers and switch-gear used to manage and maintain the flow of electricity through these conductors is typically housed in underground vaults. Numerous junction points connecting the underground electrical conductors are often accessible through manholes in the city streets. Boston, Mass., as an example, has over 100,000 manholes to provide access to its underground electrical network.

A single underground location will often have multiple, possibly dozens, of electrical conductors passing through it en route to various destinations. Multiple conductors going to the same destination often result from the inherent limitation in the electrical capacity of a single phase electrical conductor. Phase refers to a differences between the zero crossing points of several simultaneous transmissions of alternating electric current that are made on electrical current conductors, that is, each zero crossing point is delayed by a phase angle from the zero crossing points of the other transmissions of the alternating current traveling on different electrical conductors that comprise the three phase transmission. Conductors and other electrical equipment have the same phase when they are electrically connected so that alternating current can be sent from one conductor to any other in phase with it.

Moreover, because of the need to arrange conductors between junctions so that local customers may be served, multiple conductors are used to and from each junction. For example, a location accessible by manhole could contain multiple, parallel conductors meeting at several junctions, each of which is attached to additional conductors at other junctions, and others running from there to junctions at other locations. These other conductors could serve two, three, four or more additional locations that are miles from each other in the geographical area of the power network.

A power outage may be caused by a defective conductor or a failure of another electrical system component. To resolve the outage, It may be necessary to isolate the affected portion of the electric power grid in order to repair or replace those failed components. The term isolated means to be removed from electrically conductive contact from an electrical source and an electrical load, that is, disconnected from the source of electrical power and from the connections to local users of that electrical power. Standard electrical system practice dictates that, after isolating and identifying the section of conductor that is not transmitting electrical power, the conductor that has been removed from service must be electrically grounded. This practice requires that the conductors carrying three phases of the alternating current transmission must each be electrically grounded with grounding jumper conductors at the source, at each of the end points, and at any intermediate junction points that are accessible. Electrically grounding a conductor has a specific well-defined meaning provided by ASTM F855, a standard promulgated by the American Standards for Testing and Materials. This ASTM has a rating for a 4/0-5H grounding jumper conductor that may withstand 126,000 peak amps and 47,000 RMS amps for 15 cycles at 60 Hz.

Applying or removing grounding jumper conductors from these electrical conductors when they have been de-energized and removed from service can be a major undertaking involving the coordination of dozens of employees including system control supervisors, power dispatchers and many field people. In addition, grounding jumper conductors are physically large, heavy and cumbersome to remove and install. A grounded three-phase conductor may remain out of service and electrically grounded for an indefinite period of time. This concerted action may take many hours depending on the complexity and routing of the conductors involved. If the safety grounds are removed from the wrong conductors, time is wasted and, more importantly, an additional safety hazard is introduced.

There has been no method prescribed and no equipment available to the electrical utility industry for testing to determine the proper phase sequence of a three-phase conductor that is electrically grounded, and no way to determine the phase sequence of grounded conductors before removing the grounding jumper conductors. In fact, because signal tracing equipment works on electrically ungrounded conductors, it is industry practice to first remove the grounding jumper conductors and then identify each piece of equipment that is in phase with each other piece of equipment, which is a major reason the repair of a portion of an electrical grid requires so much time and so many employees. In addition, the action of removing the grounds introduces a safety hazard to those employees testing the conductors from unwanted stray induced voltages on the de-energized conductors by nearby energized conductors and from the inadvertent energizing the conductor undergoing testing.

A method for testing and determining the phase of electrically-grounded, three-phase conductors before removing the grounding jumper conductors would have significant advantages to electrical utilities in safety and time saved, and to the customers they serve.

SUMMARY OF THE DISCLOSURE

Presently disclosed is a method and system for sorting and identifying the phases of electrically grounded electrical conductors before removing the grounding jumper conductors at locations other than the source.

In one aspect of the present disclosure, the method comprises the step of applying high electrical current pulses referenced to ground to each one of the electrical conductors of the three-phase conductor at the conductor source to identify other electrical conductors connected to the electrical conductor to which the pulse is applied. In its simplest form, one pulse per second could be used to identify an A phase electrical conductor; two pulses per second, to identify a B phase electrical conductor, and three pulses per second, to identify a C phase electrical conductor.

High current pulses can travel the electrically grounded electrical conductors from the source where they are first applied forward to seek available grounds. Since the grounding jumper conductors attached to the conductors at the junction points and at the end points are effectively in parallel, some portion of the high current pulse will inevitably be distributed to the farthest conductor in parallel with the one to which the current pulse was applied, even if it is miles from the source. By using a sufficiently sensitive magnetic current sensing receiver, the identifying pulses can be detected anywhere along the series of electrical conductors, at a junction or at terminal points, and the phases detected on the electrically grounded conductor can be identified based on the pulse code or sequence applied by the source.

An aspect of the disclosure is a method for sorting plural electrical conductors by phase. The method includes the steps of applying grounding jumper conductors to plural electrical conductors of a multi-phase electrical conductor network, then applying an electrical pulse to a first electrical conductor of said electrical conductors; detecting whether the electrical pulse is carried by a second electrical conductor of the electrical conductors; and identifying the second electrical conductor as being in phase with the first electrical conductor if the electrical pulse is detected as being carried by the second electrical conductor.

An aspect of the disclosure is that the electrical pulse is an electrical current pulse, and may be a high current electrical pulse, which may be, for example ten amperes and may have a duration of less than one second.

Another aspect of the disclosure is that the detector detects a magnetic pulse emanating from the second electrical conductor which pulse corresponds to the electrical current pulse being carried by the second electrical conductor, which current pulse is one of the phases of the multi-phase electrical conductor network.

Another aspect of the disclosure is that the method comprises the steps of removing a first grounding jumper conductor from the first electrical conductor and a second grounding jumper conductor from the second electrical conductor after the second electrical conductor is identified as being in phase with the first electrical conductor.

An aspect of the disclosure is that the electrical pulse may be repeated at intervals.

Another aspect of the disclosure is a method for sorting electrical conductors by phase, which method includes the steps of grounding electrical conductors of a multi-phase electrical conductor network; then applying a first electrical code to a first electrical conductor of the multi-phase electrical power network and a second electrical code to a second electrical conductor of the multi-phase electrical conductor network; detecting whether the first electrical code and the second electrical code are being carried by a third electrical conductor and a fourth electrical conductor of the multi-phase electrical conductor network; identifying the third electrical conductor as being in phase with the first electrical conductor if the first electrical code is detected as being carried by the third electrical conductor; identifying the third electrical conductor as being in phase with the second electrical conductor if the second electrical code is detected as being carried by the third electrical conductor; identifying the fourth electrical conductor as being in phase with the first electrical conductor if the first electrical code is detected as being carried by the fourth electrical conductor; and identifying the fourth electrical conductor as being in phase with the second electrical conductor if the second electrical code is detected as being carried by the fourth electrical conductor.

Another aspect of the disclosure is that the first electrical code is a first electric current code and the second electrical code is a second electrical current code wherein the first electrical current code is different than the second electrical current code.

Another aspect of the disclosure is that the first electrical current code comprises a first series of current pulses and the second electrical current code comprises a second series of current pulses in which the second series of current pulses are different from the first series of pulses.

An aspect of the disclosure is detecting magnetic pulses that correspond to the first series of current pulses carried on the first electrical conductor when the third electrical conductor is in phase with the first electrical conductor, and detecting magnetic pulses that correspond to the second series of current pulses carried by the second electrical conductor when the second electrical conductor is in phase with the second electrical conductor.

Another aspect of the disclosure is that the first series of current pulses and the second series of pulses may have the same magnitude and the same duration and not have the same number of pulses.

An aspect of the disclosure is applying a grounding jumper conductor to each electrical conductor before beginning to identify phases of the electrical conductors of the electrical power network and removing the grounding jumper conductor from each electrical conductor of said electrical conductors when finished.

An aspect of the disclosure is a method for sorting electrical conductors by phase. The method comprises the steps of applying grounding jumper conductors to electrical conductors of an electrical power network, and then applying a first electrical current pulse sequence to a first electrical conductor of the electrical power network, a second electrical current pulse sequence to a second electrical conductor of the electrical power network, and a third electrical current pulse sequence to a third electrical conductor of the electrical power network. The first electrical current pulse sequence identifies a first phase; the second electrical current pulse sequence identifies a second phase; and the third electrical current pulse sequence identifies a third phase. Then magnetic pulses produced in the electrical connectors of the conductor network are detected, the magnetic pulses being produced by the first electrical current pulse sequence, the second electrical current pulse sequence, and the third electrical current pulse sequence. The magnetic pulses generated by the electrical connectors of the conductor network are compared to the first electrical current pulse sequence, the second electrical current pulse sequence, and the third electrical current pulse sequence to identify the first phase, the second phase, and the third phase, respectively, as carried by electrical connectors of the conductor network. The electrical conductors of the electric conductor network are then identified as being connected to the first electrical conductor and therefore in phase with the first phase, as being connected to the second electrical conductor and therefor in phase with the second electrical conductor, and as being connected to the third electrical conductor and therefore in phase with the third electrical conductor. Then, the grounding jumper conductors are removed from the electrical connectors.

Another aspect of the disclosure is tagging the electrical conductors when they are identified and displaying the phases identified with the electrical conductors when they are identified.

An aspect of the disclosure is a system for sorting grounded conductors by phase using a pulsed current source unit and a pulsed current detector unit. The pulsed current source unit applies a pulse code to a first electrical conductor and the pulsed current detector unit senses pulses, including those at a different electrical conductor. When the pulse code applied to the first electrical conductor by the pulse code source matches the pulses detected on the different electrical conductor, the first electrical conductor and the different electrical conductor have been identified as in phase.

An aspect of the disclosure is that the pulsed current source unit includes a direct current power source such as a lithium ion battery powering a first processor with an output lead connected to a first relay. The pulsed current source unit also has a shunt to ground. The processor controls the opening and closing of the first relay and, by so doing, generates a current pulse that can be applied to the first electrical conductor at one part of an electrical power system. The pulsed current detector unit has a clamp for encircling an electrical conductor. An output lead from the clamp connects to a second processor. If a current pulse appears on the different electrical conductor, it will briefly generate a magnetic field around that electrical conductor that will in turn generate a corresponding electrical current pulse in its output lead to the second processor in the pulse detector unit. The second processor in turn generates an output related to the electrical current. The indicator may be an audible beep or a visible display such as a light or graphic display. When the pulse detected on the different electrical conductor matches the pulse placed on the first electrical conductor by the pulsed current source unit, the two electrical conductors are in phase.

These and other features and their advantages will be apparent to those skilled in the art of electrical power system maintenance and repair from a careful reading of the Detailed Description, accompanied by the drawings.

BRIEF DESCRIPTION OF THE DRAWINGS

In the figures.

DETAILED DESCRIPTION OF THE DISCLOSURE

The present disclosure describes an apparatus and method for phase identification of electrically-grounded, multi-phase electric conductors.

Figure 1:
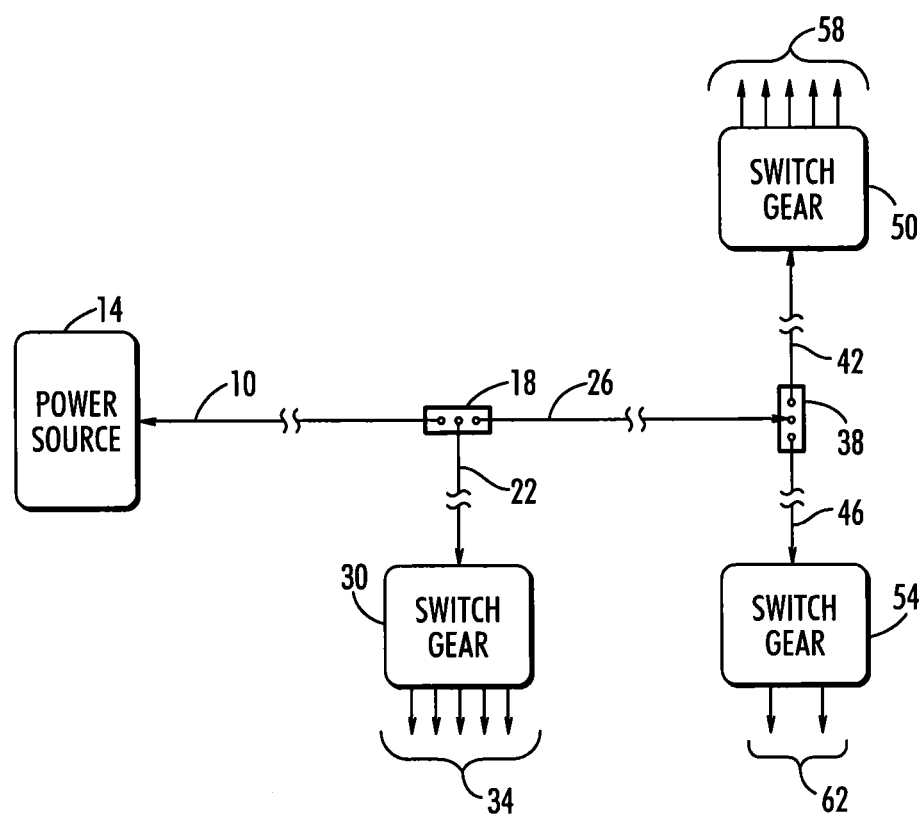
FIG. 1 is a schematic diagram of an example of an in-service, single-phase, electrical circuit including a source of electrical power, two junction points and three terminal ends, connected by electric conductors.

Referring now to FIG. 1, there is shown a simple, one-conductor diagram illustrating a single phase electrical conductor of a high-voltage, three-phase underground electrical power network, as an example of a portion of the electric grid system in a large city. Typically, an electrical power network is a group of conductors deployed over an area, each conductor of which is insulated and electrically interconnected at junctions so as to deliver alternating current electrical power in multiple phases to a geographical area. The alternating electrical current flows in each of three electrical conductors with the voltage of each phase crossing the zero point 120 degrees apart with respect to each other.

In the example of FIG. 1, an electrical conductor 10 originates at an electrical power source 14, which may be a transformer or primary feeder. This electrical power source 14 would typically be positioned in an underground vault designed to permit installation and removal of large pieces of electrical equipment. The electrical power is transferred from electrical power source 14 to junction 18 where the electrical power is forwarded in two directions, via electrical conductor 22 and electrical conductor 26. Junction 18 may be accessible through a manhole in the street. A junction is device that permits an electrical conductor to end and one or more additional electrical conductors to begin, and the electricity of the first electrical conductor passes through the junction to the next one or more electrical conductors.

Power is transferred to a terminal 30 where it will be transformed to lower voltage and distributed to individual electric customers via multiple underground feeders 34. A feeder is an electrical conductor that runs to and end user, such as a home, apartment building, or commercial building. Power is also transferred via electrical conductor 26 to junction 38 where it is again split and travels in two directions, via electrical conductor 42 and electrical conductor 46. Junction 38 may also be accessible through a second manhole in the street. Two additional terminals 50, 54, transform the remainder of the power to lower voltage and distribute it to additional electric customers via multiple underground feeders 58, 62.

Figure 2:
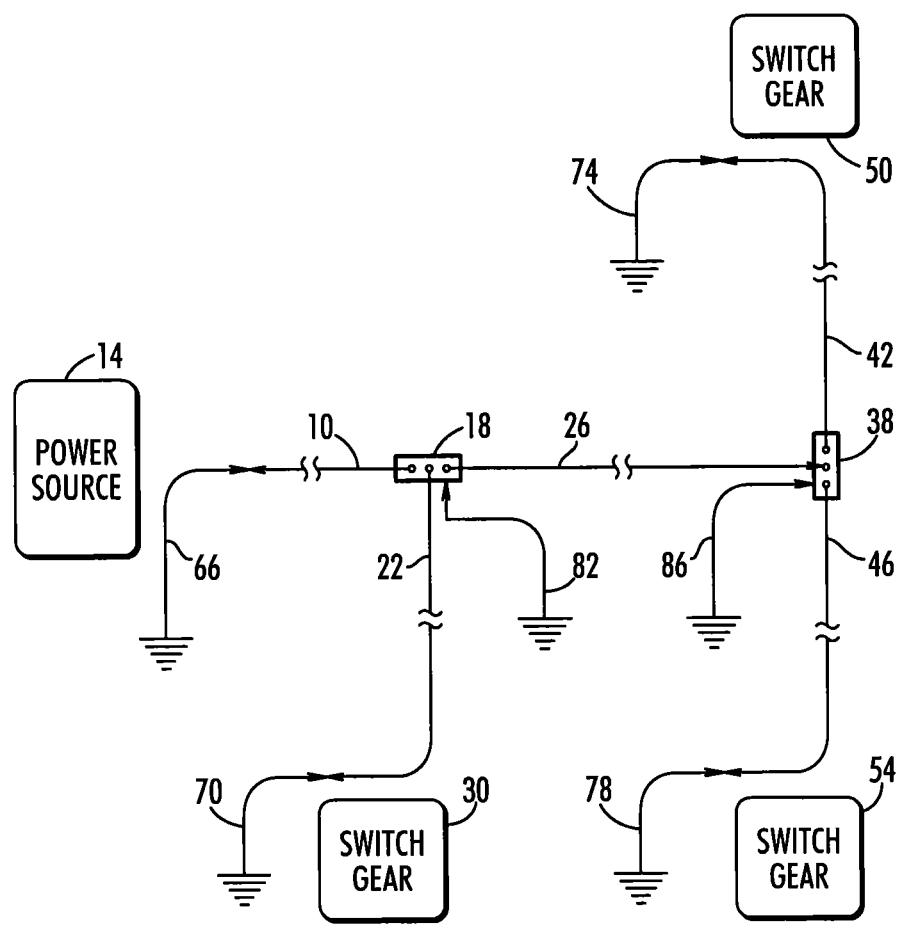
FIG. 2 is a schematic diagram of the circuit of FIG. 1 showing the electric conductors removed from service and using grounding jumper conductors (1) at the sources of the conductors, (2) at their junctions, and (3) at the terminals, according to the prior art.

FIG. 2 shows the same diagram as shown in FIG. 1, with electrical conductors 10, 22, 26, 42, and 46 removed from service and electrically grounded per universal electric utility standards with portable grounding jumper conductors at the source, junction points and terminal ends. Grounding jumper conductors are used for grounding electrical conductors. Grounding jumper conductors 66, 70, 74, and 78 have been attached to the ends of electrical conductors 22, 26, 42, and 45, respectively, and grounding jumper conductors 82, 86, have been attached to junctions 18, and 38, respectively. The illustrated network would thus be and remain out of service for an indefinite period of time. Grounding jumper conductors are typically 180 cm (6 feet) long and 2/0 gauge.

Figure 3:
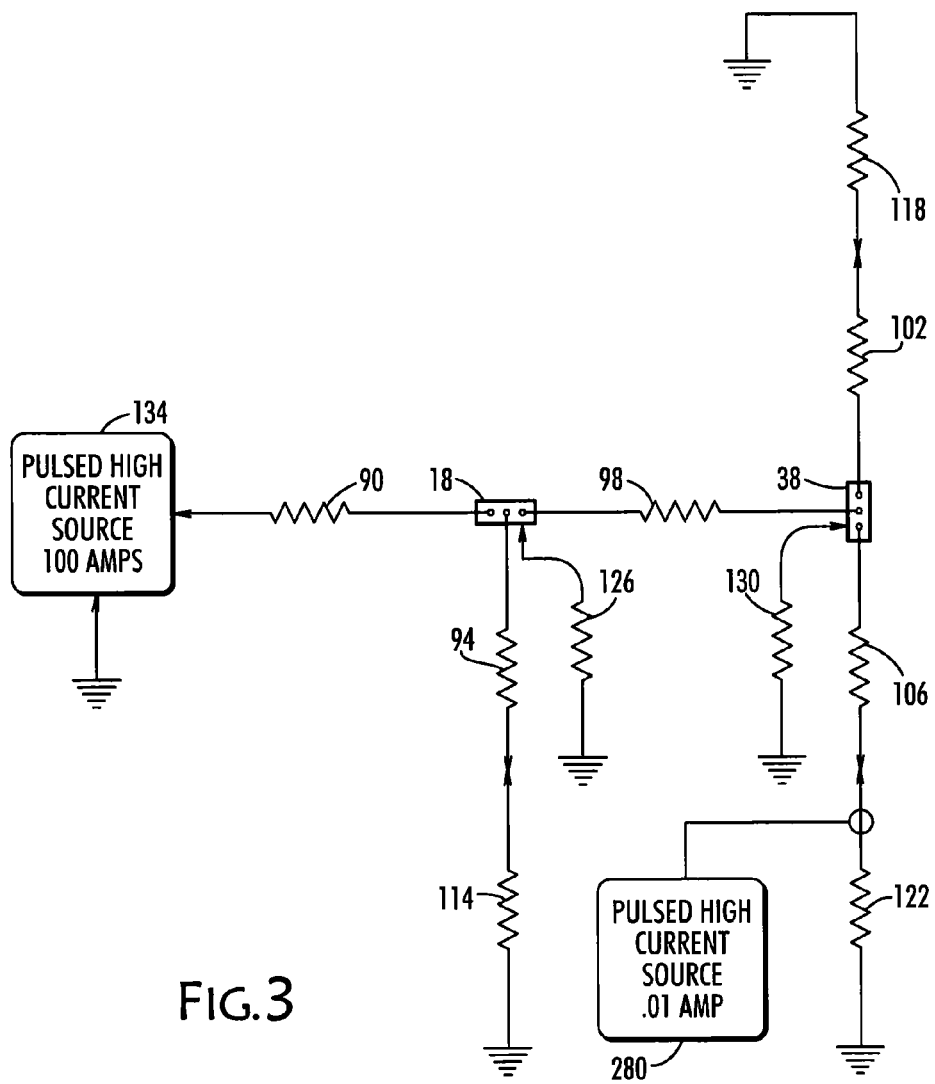
FIG. 3 is a schematic representation of the circuit of FIG. 2 with the conductors and grounding jumper conductors of FIG. 2 replaced by resistors having a resistance equivalent to the impedance of the conductors plus the grounding jumper conductors to provide an electrical current sufficient to be measured by the detector decoder.

FIG. 3 shows the same electrically grounded network with electrical conductors 22, 26, 42, and 46, and grounding jumper conductors 66, 70, 74, 78, 82, and 86, now replaced by resistors with an impedance equivalent to that of the electrical conductor or grounding jumper conductor the resistor replaced. In this example, the lengths of the electrical conductors and grounding jumper conductors are exemplary and the impedances of the conductors assumed based on the manufacturer's specification for the type of electrical conductors. The impedance for the length and type of electrical conductor was then calculated and used to determine the current present in the resistor, which was calculated at 0.01 amperes, and which level is measurable, particularly if the detector/decoder includes circuitry to filter out 60 Hz noise.

The following table includes the electrical conductors' and grounding jumper conductors' reference numbers and equivalent resistors' reference numbers, the types of conductor (which indicates its impedance per foot), the lengths of each conductor and grounding jumper conductors, and the impedances of each electrical conductor and grounding jumper conductor.

| Conductor = resistor | Type | Length | Impedance |
| --- | --- | --- | --- |
| 10/90 | 1000 MCM | 1500 ft | 32.4 milliohms |
| 22/94 | 1000 MCM | 1000 ft | 21.6 milliohms |
| 26/98 | 1000 MCM | 4500 ft | 97.2 milliohms |
| 42/102 | 1000 MCM | 850 ft | 18.4 milliohms |
| 46/106 | 1000 MCM | 3000 ft | 64.8 milliohms |
| 70/114 | 2/0 | 6 ft | 0.95 milliohms |
| 74/118 | 2/0 | 6 ft | 0.95 milliohms |
| 78/122 | 2/0 | 6 ft | 0.95 milliohms |
| 82/126 | 2/0 | 6 ft | 0.95 milliohms |
| 86/130 | 2/0 | 6 ft | 0.95 milliohms |

Electrical conductor 10 is replaced by resistor 90; electrical conductor 22, by resistor 94; electrical conductor 26, by resistor 98; electrical conductor 42, by resistor 102; electrical conductor 46, by resistor 106; grounding jumper conductor 70, by resistor 114; grounding jumper conductor 74, by resistor 118; grounding jumper conductor 78, by resistor 122; grounding jumper conductor 82, by resistor 126; and grounding jumper conductor 86, by resistor 130. The impedance of each ground jumper conductor is calculated as being less than one milliohm. Five of these grounding jumper conductors, namely, grounding jumper conductors 74, 78, 82, 86, are in parallel and attached to electrical conductors 10, 26, 42 and 46, would have a resulting parallel impedance of $\frac{1}{5}$ of a milliohm with respect to ground. This level is for all intents and purposes an electrically grounded power line.

Actual detectable pulse current for a physical system with the conductors and jumper conductors of these lengths is likely to be larger than that calculated above because of slightly higher impedances typically encountered in a real system.

Figure 4:
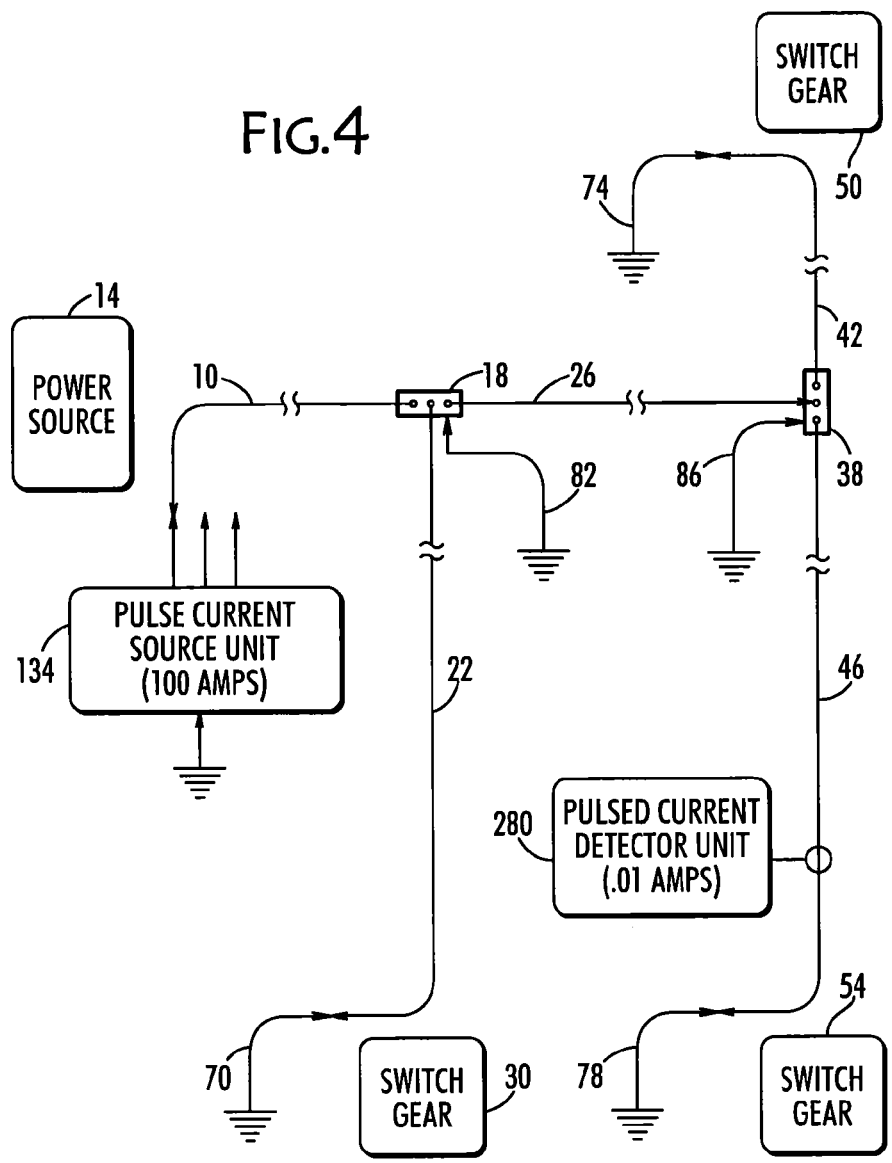
FIG. 4 is a schematic diagram of the prior art circuit of FIG. 2 now shown with a pulsed high current source attached to a nearby electrical conductor and a pulsed magnetic field, electrical current sensor and detector attached to a remote conductor near its terminal end, according to an aspect of the disclosure.

In FIG. 4, unlike FIG. 2, a pulsed current source unit 134 is attached to electrical conductor 10 and produces direct current pulses of 100 amps having a duration of 2 milliseconds. The duration of the pulses is not so short as to be unduly difficult to detect. The pulses may be repeated with a frequency of one pulse per second, for example, a frequency short enough to be recognizable as an intentional sequence or signal and not so frequently that the pulses or sequences of pulses seem to run together. A simple sequence of pulses can be assigned to each phase to identify the phase of the electrical conductor having that pulse sequence on it, such as one pulse for the first phase of three phases, two pulses for the second of three phases, and three pulses for the third of three.

The electrical current of each pulse is high enough to be detectable at the end of the electrical conductor by a sensitive detector, despite the distance and the need to pass through electrically grounded junctions. A high-current pulse sequence of 100 amps/pulse travels from pulsed current source unit 134 to junction 18 where approximately 99 amps of the original 100 amps in the originating current pulse is shunted to ground via grounding jumper conductor 82. The remaining one amp continues to junction 38 where again the majority of the one amp is shunted to ground by grounding jumper conductor 86. There is sufficient remaining pulsed electrical current at additional terminals 30, 50, 54, for example, 0.01 amps, to be detected and decoded by a sensitive device, such as pulsed current detector unit 280 and to clearly identify the electrical pulse sequence carried by electrical conductors 10, 26, 42 and 46.

Figure 5:
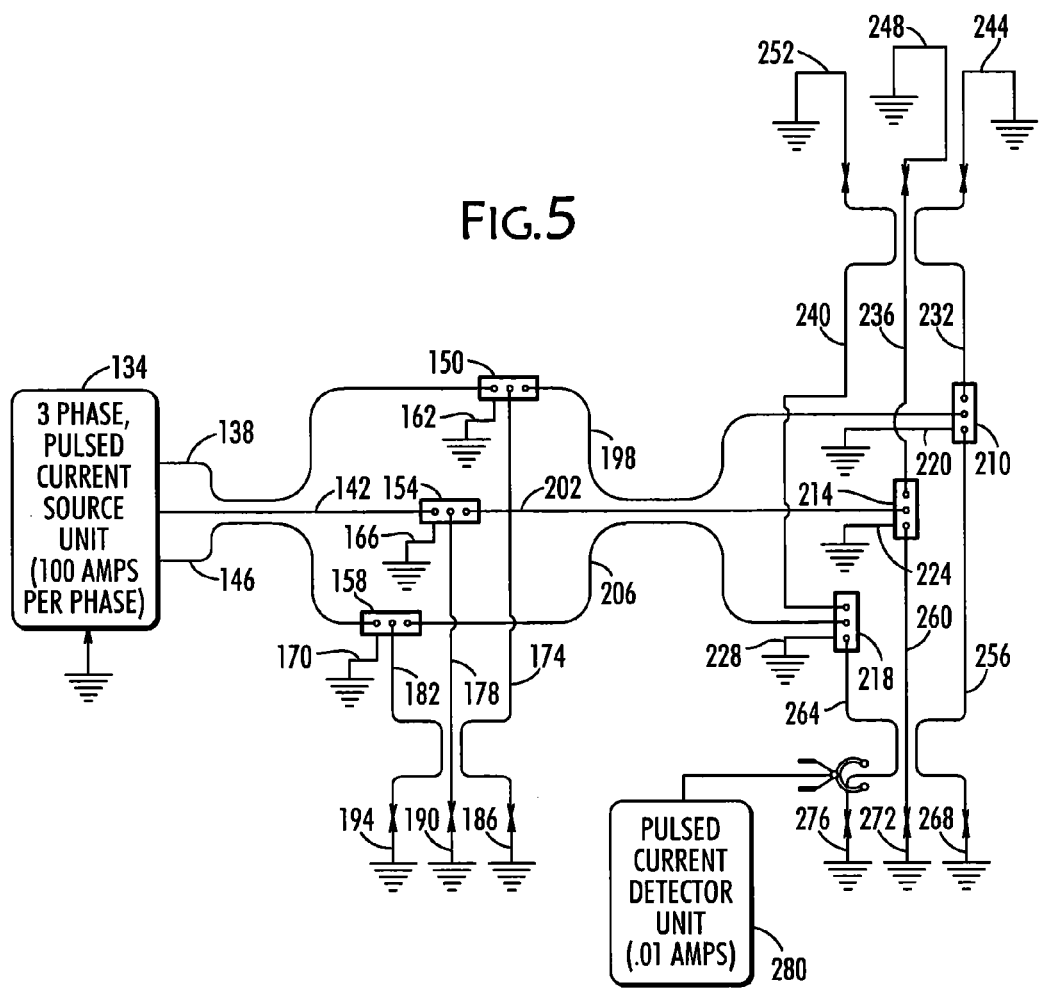
FIG. 5 is a schematic diagram showing a three-phase version of the electric circuit of FIG. 4, including coded output pulses from a three-phase, pulsed, high-current source to an electrical circuit including two junction points and three terminal ends for each phase, according to an aspect of the disclosure.
Figure 7:
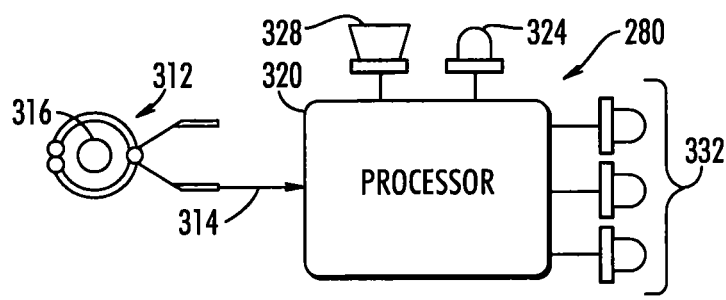
FIG. 7 is a block diagram of the pulse code detection unit, according to an aspect of the disclosure.

FIG. 5 shows an exemplary circuit similar to that shown in FIG. 4 with a three-phase conductor with three electrical conductors. A three-phase, pulsed current source unit 134 produces pulsed sequences via each of three outputs to three electrical conductors 138, 142, and 146. Each of the three high-current-output, pulsed sequences is different from the others, so as to enable identification of each of the three phases but the pulsed sequence it carries. Once the three electrical conductors 138, 142, and 146 are connected to pulsed current source unit 134, a user can go to every location and safely detect and tag each electrical conductor with an identification tag to indicate the appropriate phase using a pulsed current detector unit 280. Pulsed current detector unit 280 senses a magnetic field generated by an electric current pulse. It is used to detect and decode high electric current pulse sequences on any of the electrical conductors, and is shown in FIG. 7 being used to detect and decode pulses on electrical conductor 316. If the pulsed sequence on electrical conductor 264 matches that on electrical conductor 146, then the two are in electrical connection with each other, that is, in phase with each other, and therefore any alternating current applied to electrical conductor 146 will be in phase with the alternating current flowing through electrical conductor 264. When electrical conductor 206 is found to have the same pulse sequence on it as electrical conductors 146 and 264, then grounding jumper conductors 170, 252, and 276 can be removed and electrical conductor 146 can be energized.

Similarly, electrical conductors 138, 142, and 146 lead to junctions 150, 154, and 158, respectively, which are electrically grounded by three grounding jumper conductors 162, 166, and 170, one for each junction 150, 154, and 158. From junctions 150, 154, and 158, three electrical conductors 174, 178, and 182, are connected to three more grounding conductors 186, 190, and 194, respectively. Another three electrical conductors 198, 202, and 206, lead from junctions 150, 154, and 158, to a second set of three junctions 210, 214, and 218, respectively, each of which is electrically grounded through grounding jumper conductors 220, 224, and 228, respectively). From junctions 210, 214, and 218, electrical conductors run in two opposing directions: electrical conductors 232, 236, and 240, run to ground via grounding jumper conductors 244, 248, and 252, respectively, and electrical conductors 256, 260, and 264 run to ground via grounding jumper conductors 268, 272, and 276, respectively.

Figure 6:
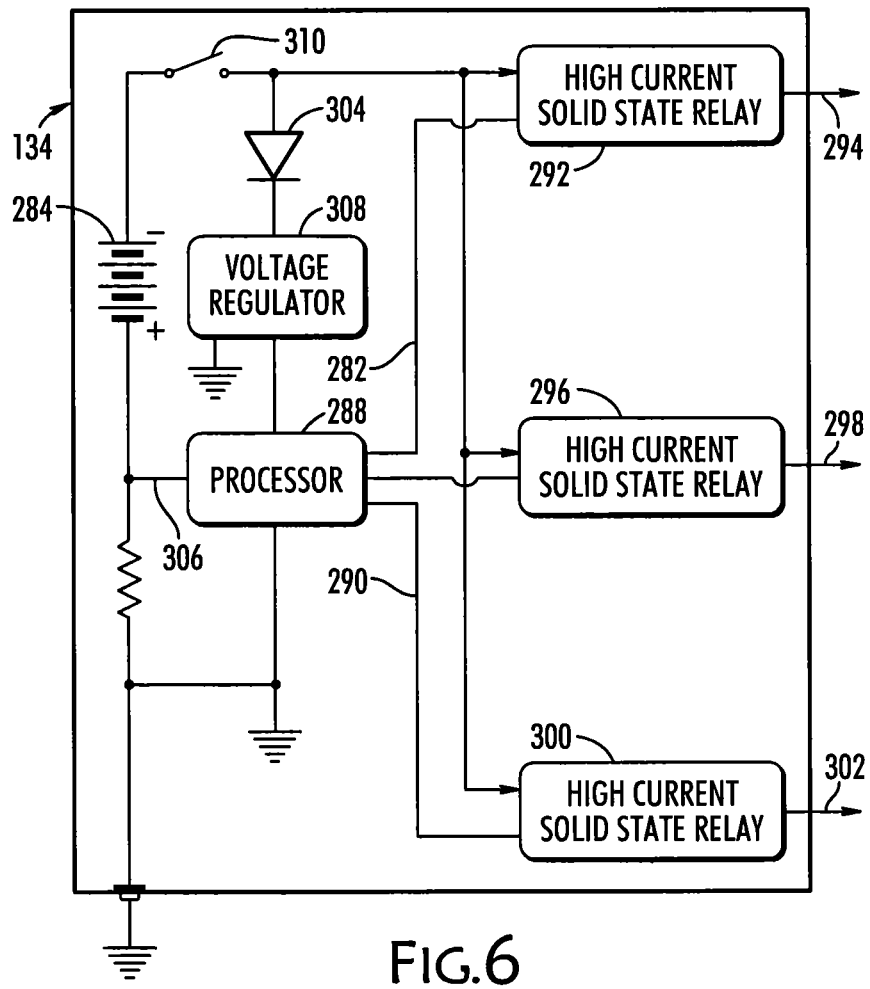
FIG. 6 is a circuit diagram of the pulsed current source unit, according to an aspect of the disclosure.

FIG. 6 is a block diagram of the three-phase, coded, pulsed, high-current, pulsed current source unit 134. Pulsed current source unit 134 may be activated by a switch 310 and powered by a low-voltage, high-current, DC power source 284. To make pulsed current source unit 134 portable, a light-weight, high-current lithium-ion battery may be used as power source 284 to provide power for the pulses to be generated. Many such batteries are capable of several hundred amps for short durations.

Pulsed current source unit 134 also contains a first processor 288 powered by power source 284 and programmed to operate via a first, a second, and a third relay 292, 296, 300, respectively, to three outputs 282, 286, 290, respectively, and to control the generation of pulses by the operation of relays 292, 296, 300, in terms of amplitude, duration, and timing so that each relay 292, 296, 300, generates a different pulse code. Each relay 292, 296, 300, is a high-current, solid-state relay and has an electrical lead 294, 298, 302, connected to its respective output that can be applied to one of three electrical conductors 138, 142, 146 (best seen in FIG. 5) at one part of an electrical power network. A shunt 306 for high current from first processor 288 to ground provides an analog input to processor 288 as an indication of the instantaneous pulsed current levels present on the three electrical conductors 138, 142, 146. Power provided by power source 284 may be routed to first processor 288 via a diode 304 and voltage regulator 308.

FIG. 7 shows the handheld, portable, pulsed current detector unit 280. A clamp 312 on current detector unit 280 encircles an electrical conductor 316 to be tested and detects the current pulse, if any, carried on electrical conductor 316 from the magnetic field change generated by the pulse in electrical current from pulsed current source unit 134 that appears on electrical conductor 316. The magnetic pulse generates an electrical current pulse in the lead 314 from clamp 312 to a processor 320. Processor 320 receives the analog input from clamp 312. Any current pulse signal present on electrical conductor 316, regardless of the phase or code, is indicated visually and audibly by the corresponding signals from visual and audio indicators 324 and 328. The term code in the simplest form is a visual or audible signal that corresponds to that designated for a time-varying current phase. For example, phases could be represented by audible "beeps": one beep per second for the first phase, two beeps per second for the second phase, and three beeps per second for the third phase in a three phase alternating electrical power system. Alternatively, the designation for phases can be based on "dots and dashes" of International Morse Code letters for A, B and C. Processor 320 may decode, for example, by counting the received pulses and display the corresponding phase using a digital or visual display, such as three light emitting diodes (LEDS) 332, as a visual indicators of the phase corresponding to the pulse code on receipt of the output of processor 320, one LED 332 for the first phase, two LEDs 332 for the second phase and three LEDs 332 for the third phase, for example.

Figure 8:
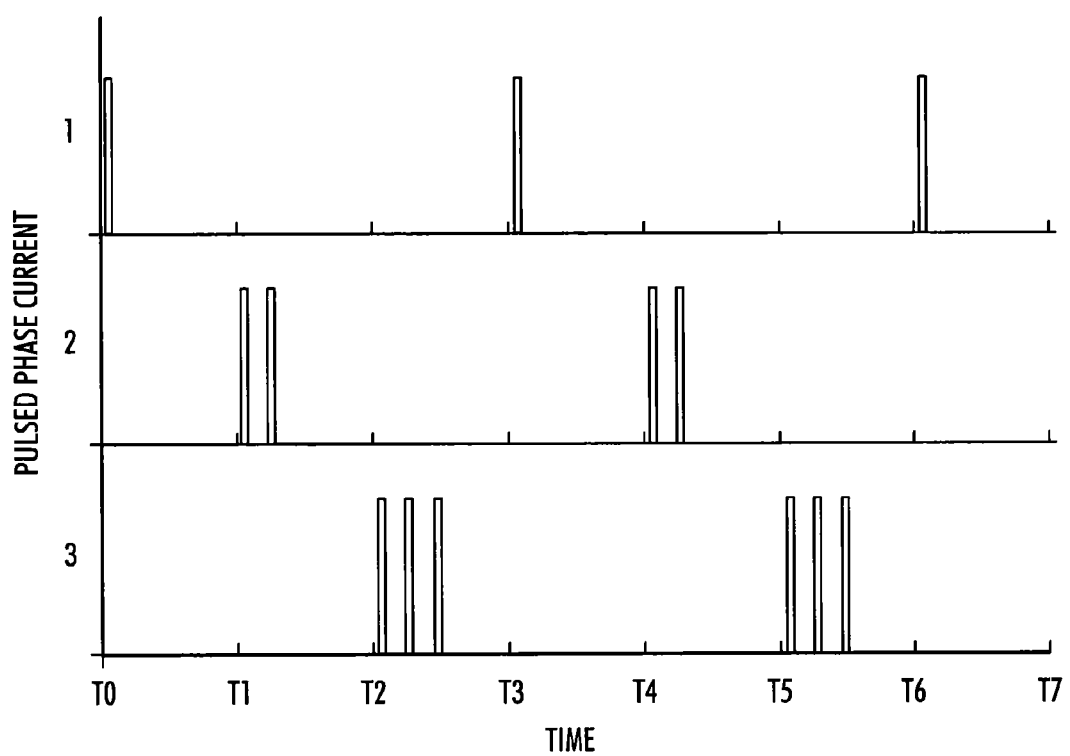
FIG. 8 is a graphical representation of the coded current pulses as applied to the conductors used for the three phases.

FIG. 8 is a graphic representation of the three-phase current pulses shown in a simple three part graph in which one high-current pulse per second represents the first phase in the top portion of the graph. Two high-current pulses per second represent the second phase in the middle portion of the graph. Three high-current pulses per second in the bottom portion off the graph represent the third phase.

Figure 9:
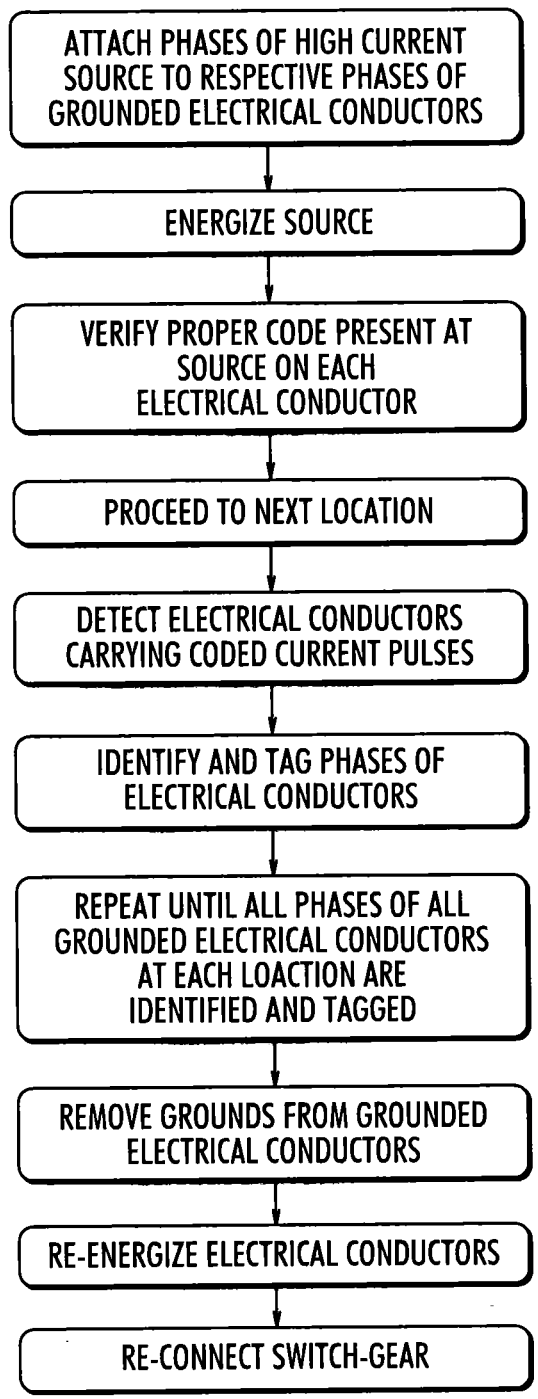
FIG. 9 is a flow diagram of the present method for identifying the phase of an unknown, grounded conductor, according to an aspect of the disclosure.

FIG. 9 is a flow diagram of the present method. Initially, the electrical conductors have all been grounded by applying grounding jumper conductors between the conductors and the local, physical ground. Then, a DC high current pulse source, such as pulsed current source unit 134, is connected to each electrical conductor of the three-phase electrical conductor and differently coded current pulses are applied to each of the three electrical conductors of that conductor. The pulse source is energized. The user next verifies that the proper code sequence is on each of the three conductors using a pulse detector such as pulsed current detector unit 280, to verify the pulse sequence applied to each electrical conductor is the correct one being detected.

The user then proceeds to the next location and uses pulsed current detector unit 280 to detect the pulse sequences on the electrical connectors there is used to detect a current pulse sequence on the electrical conductors. The phase of each electrical conductor that has a pulse sequence is then identified by the particular sequence it carries and tagged accordingly. The user continues until all phases of all grounded electrical conductors at each location has been identified and tagged. After the electrical conductors are tagged, the ground jumper conductors can be removed and the electrical conductors can be re-energized and the switchgear reconnected.

What is claimed is:

1. A method, comprising the steps of:
   grounding plural electrical conductors of a multi-phase electrical conductor network;
   applying an electrical pulse to a first electrical conductor of said plural electrical conductors;
   detecting with a pulse current detector unit whether said electrical pulse is being carried by a second electrical conductor of said plural electrical conductors; and
   identifying with said pulse current detector unit said second electrical conductor as being in phase with said first electrical conductor if said electrical pulse is being carried by said second electrical conductor.

2. The method of claim 1, wherein said electrical pulse is an electrical current pulse.

3. The method of claim 2, wherein detecting further comprises detecting a magnetic pulse corresponding to said electrical current pulse being carried by said second electrical conductor if said electrical current pulse is being carried by said second electrical conductor.

4. The method of claim 1, wherein said electrical pulse is an electrical current pulse of at least 10 amperes.

5. The method of claim 1, wherein said electrical pulse corresponds to a phase of said multi-phase electrical conductor network.

6. The method of claim 1, further comprising the steps of removing a first jumper conductor from said first electrical conductor and a second jumper conductor from said second electrical conductor after said second electrical conductor is identified as being in phase with said first electrical conductor.

7. The method of claim 1, wherein said electrical pulse has a duration of less than one second.

8. The method of claim 1, wherein said electrical pulse is repeated at intervals.

9. A method, comprising the steps of:
   grounding plural electrical conductors of a multi-phase electrical conductor network;
   applying a first electrical code to a first electrical conductor of said multi-phase electrical conductor network and applying a second electrical code to a second electrical conductor of said multi-phase electrical conductor network;
   detecting with a pulsed current detector unit whether said first electrical code and said second electrical code are being carried by a third electrical conductor and a fourth electrical conductor of said multi-phase electrical conductor network;
   identifying with said pulsed current detector unit said third electrical conductor as being in phase with said first electrical conductor if said first electrical code is detected as being carried by said third electrical conductor;
   identifying with said pulsed current detector unit said second electrical conductor as being in phase with said third electrical conductor if said second electrical code is detected as being carried by said third electrical conductor;

identifying with said pulsed current detector unit said fourth electrical conductor as being in phase with said first electrical conductor if said first electrical code is detected as being carried by said fourth electrical conductor; and identifying with said pulsed current detector unit said fourth electrical conductor as being in phase with said second electrical conductor if said second electrical code is detected as being carried by said fourth electrical conductor.

10. The method of claim 9, wherein said first electrical code is a first electrical current code and said second electrical code is a second electrical current code, and wherein said first electrical current code is different than said second electrical current code.

11. The method of claim 10, wherein said first electrical current code comprises a first series of current pulses and said second electrical current code comprises a second series of current pulses, said second series of current pulses being different from said first series of current pulses.

12. The method of claim 11, wherein detecting further comprises the step of detecting magnetic pulses generated by said first series of current pulses carried by said third electrical conductor if said third electrical conductor is in phase with said first electrical conductor, and detecting magnetic pulses generated by said second series of current pulses generated by said third electrical conductor if said second electrical conductor is in phase with said second electrical conductor.

13. The method of claim 11, wherein said first series of current pulses have a first duration of said second series of current pulses has a second duration, and wherein said first duration is equal to said second duration.

14. The method of claim 11, wherein said first series of current pulses has a first number of pulses and said second series of pulses has a second number of pulses, and wherein said first number of pulses is different than said second number of pulses.

15. The method of claim 9, wherein grounding further comprises the step of applying a grounding jumper conductor to an electrical conductor of said plural electrical conductors.

16. The method of claim 15, further comprising the step of removing said grounding jumper conductor from said electrical conductor of said plural electrical conductors.

17. A method comprising the steps of:
applying grounding jumper conductors to plural electrical conductors of an electrical power network;
applying a first electrical current pulse sequence to a first electrical conductor of said electrical power network, a second electrical current pulse sequence to a second electrical conductor of said electrical power network, and a third electrical current pulse sequence to a third electrical conductor of said electrical power network, said first electrical current pulse sequence identifying a first phase, said second electrical current pulse sequence identifying a second phase; and said third electrical current pulse sequence identifying a third phase;
detecting with a pulsed current detector unit magnetic pulses generated by a fourth electrical conductor of said electrical power network, said magnetic pulses being produced on said electrical conductors by said first electrical current pulse sequence, said second electrical current pulse sequence, and said third electrical current pulse sequence;
comparing with said pulsed current detector unit said magnetic pulses generated by said electrical conductors of said electrical power network to said first electrical current pulse sequence, said second electrical current pulse sequence, and said third electrical current pulse sequence to identify said first phase, said second phase, and said third phase, respectively, being carried by said electrical conductors of said electrical power network; and
identifying with said pulsed current detector unit said electrical conductors of said electric power network as being connected to said first electrical conductor and therefore carrying a first phase, as being connected to said second electrical conductor and therefore carrying a second phase, and as being connected to said third electrical conductor and therefore carrying a third phase; and
removing said grounding jumper conductors from said electrical conductors.

18. The method of claim 17, further comprising the step of tagging said electrical conductors.

19. The method of claim 17, further comprising the step of displaying phases of said electrical conductors.

20. A system, comprising:
a pulsed current source unit having
a direct current power source,
a first relay having an input and an output, said direct current power source being connected to said input of said first relay,
an electrical lead connected to said output of said first relay,
a first processor having an input connected to said direct current power source and an output connected to said first relay, said first processor controlling opening and closing said first relay, and
a shunt connected to said first processor, said shunt bypassing said first processor to ground; and
a pulsed current detector unit having
a clamp having an output lead operable to produce an electric current when said clamp senses a change in a magnetic field,
a second processor connected to said output lead, said second processor receiving an electrical current when said clamp senses a change in said magnetic field, said second processor producing an output related to said electrical current, and
an indicator connected to said second processor and responsive to receipt of said output.

21. The system as in claim 20, wherein said indicator is audible.

22. The system as in claim 20, wherein said indicator is a visible display.

23. The system as in claim 20, further comprising a second relay and a third relay, said second relay and said third relay being in electrical connection with said first processor.

* * * * *